United States Patent
Xue et al.

(10) Patent No.: US 12,464,930 B2
(45) Date of Patent: Nov. 4, 2025

(54) FLEXIBLE DISPLAY SUBSTRATE AND MANUFACTURING METHOD THEREFOR, AND DISPLAY DEVICE

(71) Applicant: BOE Technology Group Co., Ltd., Beijing (CN)

(72) Inventors: Jinxiang Xue, Beijing (CN); Xiaolei Zhang, Beijing (CN); Zhongyuan Sun, Beijing (CN); Wenqi Liu, Beijing (CN); Kai Sui, Beijing (CN); Jingkai Ni, Beijing (CN); Xiang Zhou, Beijing (CN); Che An, Beijing (CN); Guoqiang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 756 days.

(21) Appl. No.: 17/763,919

(22) PCT Filed: May 12, 2021

(86) PCT No.: PCT/CN2021/093240
§ 371 (c)(1),
(2) Date: Mar. 25, 2022

(87) PCT Pub. No.: WO2021/254033
PCT Pub. Date: Dec. 23, 2021

(65) Prior Publication Data
US 2022/0344422 A1    Oct. 27, 2022

(30) Foreign Application Priority Data
Jun. 15, 2020  (CN) .......................... 202010544338.9

(51) Int. Cl.
H10K 59/80    (2023.01)
H10K 50/80    (2023.01)
(Continued)

(52) U.S. Cl.
CPC ......... *H10K 59/8722* (2023.02); *H10K 50/80* (2023.02); *H10K 50/844* (2023.02);
(Continued)

(58) Field of Classification Search
CPC .................................................. H10K 59/122
(Continued)

(56) References Cited

U.S. PATENT DOCUMENTS

2017/0069874 A1    3/2017  Nishinohara et al.
2019/0081273 A1*   3/2019  Sung ................. H10K 59/8731
(Continued)

FOREIGN PATENT DOCUMENTS

CN    108400261 A    8/2018
CN    109037134 A    12/2018
(Continued)

OTHER PUBLICATIONS

CN202010544338.9 first office action.

*Primary Examiner* — Ajay Arora
(74) *Attorney, Agent, or Firm* — IPro, PLLC (57) ABSTRACT

Disclosed is a flexible display substrate, including: a substrate base layer, peripheral side edges of the substrate base layer having a first stepped structure having a process performance, the first stepped structure being configured to enable a film layer covering the first stepped structure to be easily broken at the stepped structure when a force is applied; a functional layer provided on the substrate base layer and exposed to the outside of the first stepped structure; and an inorganic encapsulation layer covering side edges of the functional layer and extending to the first stepped structure of the side edges of the substrate base layer.

12 Claims, 10 Drawing Sheets

(51) Int. Cl.
*H10K 50/844* (2023.01)
*H10K 59/122* (2023.01)
*H10K 71/00* (2023.01)
*H10K 59/12* (2023.01)
*H10K 102/00* (2023.01)

(52) U.S. Cl.
CPC ............ *H10K 59/122* (2023.02); *H10K 71/00* (2023.02); *H10K 59/1201* (2023.02); *H10K 2102/311* (2023.02)

(58) Field of Classification Search
USPC .......................................................... 257/93
See application file for complete search history.

(56) References Cited

U.S. PATENT DOCUMENTS

| | | | |
|---|---|---|---|
| 2020/0152842 A1* | 5/2020 | Park | ................. H10H 29/10 |
| 2020/0152894 A1 | 5/2020 | Zhang et al. | |
| 2020/0227586 A1 | 7/2020 | Wang et al. | |
| 2021/0064091 A1 | 3/2021 | Wang et al. | |
| 2021/0359235 A1 | 11/2021 | Jiang | |

FOREIGN PATENT DOCUMENTS

| | | | | |
|---|---|---|---|---|
| CN | 109801945 A | | 5/2019 | |
| CN | 110491913 A | | 11/2019 | |
| CN | 110504294 A | | 11/2019 | |
| CN | 111180485 A | | 5/2020 | |
| CN | 111554831 A | | 8/2020 | |
| CN | 109801945 B | * | 1/2022 | ........... G06F 1/1652 |
| CN | 217506332 U | * | 9/2022 | |

* cited by examiner

Fig. 15

FLEXIBLE DISPLAY SUBSTRATE AND MANUFACTURING METHOD THEREFOR, AND DISPLAY DEVICE

CROSS REFERENCE TO RELATED APPLICATIONS

The present application is a US National Stage of International Application No. PCT/CN2021/093240, filed on May 12, 2021, which claims priority to Chinese Patent Application No. 202010544338.9, entitled "FLEXIBLE DISPLAY SUBSTRATE AND MANUFACTURING METHOD THEREFOR, AND DISPLAY APPARATUS", filed with the Chinese Patent Office on Jun. 15, 2020, the entire contents of which are incorporated herein by reference.

FIELD

The present application relates to the technical field of display, in particular to a flexible display substrate and a manufacturing method therefor, and a display apparatus.

BACKGROUND

An Organic Light-Emitting Diode (OLED) display, also known as an organic electroluminescent display, is an emerging flat panel display apparatus. Since the OLED display has the advantages of simple manufacturing process, low cost, low power consumption, high luminous brightness, wide range of working temperature adaption, light and thin volume, fast response speed, easy to realize color display, easy to realize matching with integrated circuit drivers and easy to realize flexible display, it has broad application prospects.

In recent years, with the wide use of full screens and perforated screens, the packaging requirements of narrow frames of display screens are higher and higher. Therefore, how to ensure the integrity of lateral packaging layers is the key to enhance and improve the display screens.

SUMMARY

The present application discloses a flexible display substrate and a manufacturing method therefor, and a display apparatus, in order to ensure the integrity of a lateral packaging layer of the flexible display substrate and improve the quality of the flexible display substrate.

The flexible display substrate includes: a substrate base layer, peripheral side edges of the substrate base layer having a first stepped structure with a process performance, and the first stepped structure being configured to enable a film layer covering the first stepped structure to be easily broken at the stepped structure when a force is applied; a functional layer, located on the substrate base layer and exposing the first stepped structure; and an inorganic encapsulation layer, covering side edges of the functional layer and extending to the first stepped structure of the side edges of the substrate base layer.

Optionally, the substrate base layer is of a plurality of layers of structures including a flexible substrate and an inorganic insulating layer; and the first stepped structure includes steps formed by staggering edges of adjacent layers of structures in the plurality of layers of structures and/or steps formed on edges of at least one layer in the plurality of layers of structures.

Optionally, the first stepped structure includes one or more steps, and a step surface width of each of the one or more steps ranges from 5 μm to 25 μm.

Optionally, the substrate base layer is provided with an opening hole, a second stepped structure with a process performance is provided on a side edge, at the opening hole, of the substrate base layer, and the second stepped structure is configured to enable a film layer covering the second stepped structure to be easily broken at the second stepped structure; and the inorganic encapsulation layer covers a side edge, at the opening hole, of the functional layer, and extends to the second stepped structure at the opening hole of the substrate base layer.

Optionally, the flexible display substrate is a stretchable flexible display substrate; the substrate base layer includes a plurality of island parts, bridge parts connecting the plurality of island parts and hollowed-out parts located between the island parts and the bridge parts; a third stepped structure with a process performance is provided on side edges, at the hollowed-out parts, of the substrate base layer, and the third stepped structure is configured to enable a film layer covering the third stepped structure to be easily broken at the third stepped structure; the functional layer includes pixel structures corresponding to the island parts, and each of the pixel structures is located on a corresponding island part; and the inorganic encapsulation layer covers a side edge of the each pixel structure and extends to the third stepped structure of the hollowed-out parts of the substrate base layer.

Optionally, the third stepped structure at the hollowed-out parts is located on side edges of the island parts of the substrate base layer.

Optionally, the substrate base layer includes a first-layer flexible substrate, a barrier layer, a second-layer flexible substrate, a buffer layer and an interlayer insulating layer which are sequentially provided; and the first stepped structure includes first steps formed on edges of the barrier layer and the second-layer flexible substrate.

Optionally, the first stepped structure further includes second steps formed on edges of the interlayer insulating layer and the buffer layer.

Optionally, the substrate base layer includes a flexible substrate, a barrier layer and a buffer layer which are sequentially provided; and the first stepped structure and the third stepped structure both include first steps formed on edges of the barrier layer and the buffer layer.

A method for manufacturing a flexible display substrate includes: providing a rigid substrate having a plurality of sub-regions; forming a substrate base layer and a functional layer on the rigid substrate, wherein the forming the substrate base layer and the functional layer on the rigid substrate includes forming annular hollowed-out openings corresponding to the plurality of sub-regions one by one on the substrate base layer through a patterning process, wherein each of the annular hollowed-out openings surrounds a corresponding sub-region and includes at least two layers of annular openings which are sequentially stacked in a direction perpendicular to the rigid substrate, and an orthographic projection of an opening close to the rigid substrate on the rigid substrate is located in an orthographic projection of an opening away from the rigid substrate on the rigid substrate, to form a first stepped structure with a process performance on side walls of the annular hollowed-out openings; depositing an inorganic encapsulation layer on the substrate base layer and the functional layer, the inorganic encapsulation layer covering the side walls of the annular hollowed-out openings and making contact with the rigid substrate; and stripping the rigid substrate off the substrate base layer, to enable the inorganic encapsulation layer to be broken at the annular hollowed-out openings.

Optionally, the forming the annular hollowed-out openings corresponding to the plurality of sub-regions one by one on the substrate base layer through the patterning process further includes: forming the first stepped structure on inner side walls of the annular hollowed-out openings.

Optionally, the flexible display substrate is a stretchable flexible display substrate, and the method further includes: forming a plurality of island parts, bridge parts connecting the plurality of island parts and hollowed-out parts located between the island parts and the bridge parts, on the substrate base layer in each of the plurality of sub-regions through the patterning process, and forming a second stepped structure with a process performance on side edges of the hollowed-out parts of the substrate base layer; forming patterns of pixel structures on the functional layer in the each sub-region through the patterning process, wherein the pixel structures correspond to the island parts, and each pixel structure is located on a corresponding island part; and forming the inorganic encapsulation layer on the island parts and the bridge parts, the inorganic encapsulation layer covering a side edge of each pixel structure and extending to the second stepped structure of the hollowed-out parts of the substrate base layer.

Optionally, the substrate base layer is of a plurality of layers of structures comprising a flexible substrate and an inorganic insulating layer; and a manufacturing process of the first stepped structure and the second stepped structure on the substrate base layer further includes: forming hollowed-out openings penetrating through the plurality of layers of structures through the patterning process, and enabling sizes of the hollowed-out openings of adjacent layers of structures in the plurality of layers of structures to be different, to form the first stepped structure and/or the second stepped structure.

Optionally, depositing the substrate base layer on the rigid substrate and forming the annular hollowed-out openings corresponding to the plurality of sub-regions one by one on the substrate base layer through the patterning process further include: sequentially depositing a first-layer flexible substrate and a barrier layer on the rigid substrate, and forming a first hollowed-out opening penetrating through the barrier layer through a first patterning process; sequentially depositing a second-layer flexible substrate, a buffer layer and an interlayer insulating layer on the rigid substrate, and forming a second hollowed-out opening penetrating through the buffer layer and the interlayer insulating layer through a second patterning process, wherein a width of the second hollowed-out opening is larger than a width of the first hollowed-out opening, and an orthographic projection of the second hollowed-out opening on the rigid substrate covers an orthographic projection of the first hollowed-out opening on the rigid substrate; and etching the second-layer flexible substrate exposed by the second hollowed-out opening and the first-layer flexible substrate exposed by the first hollowed-out opening through a third patterning process.

Optionally, the forming the second hollowed-out opening penetrating through the buffer layer and the interlayer insulating layer through the second patterning process further includes: forming the second hollowed-out opening through two times of etching before and after, wherein sizes of openings of the two times of etching are different, so that an inner side wall of the finally formed second hollowed-out opening is in a stepped shape.

A display apparatus includes any of the above described flexible display substrates.

DETAILED DESCRIPTION OF THE EMBODIMENTS

The technical solutions in the embodiments of the present application will be clearly and completely described below in conjunction with the drawings in the embodiments of the present application, obviously, the described embodiments are only a part of the embodiments of the present application, not all of the embodiments. Based on the embodiments in the present application, all other embodiments acquired by those of ordinary skill in the art without creative work shall fall within the protection scope of the present application.

Specifically, in a process for manufacturing a conventional flexible display substrate, a common practice is to manufacture a substrate base layer, a functional layer and an encapsulation layer on a large-size glass substrate sequentially, and then conduct annular cutting on the large-size glass substrate through a laser cutting technology, to obtain a plurality of independent display substrates. However, due to a large amount of heat generated by laser cutting, cracks are generated in an inorganic layer (a periphery of an inorganic layer of a display substrate) of a periphery of a cutting position, and extension of the cracks to the inside may seriously affect the encapsulation reliability. Therefore, it is necessary to reserve enough laser cutting heat affected areas for general laser cutting to ensure the encapsulation reliability.

For this purpose, an inventor of the present application provides a method for manufacturing a flexible display substrate, including the following operations.

Figure 1:
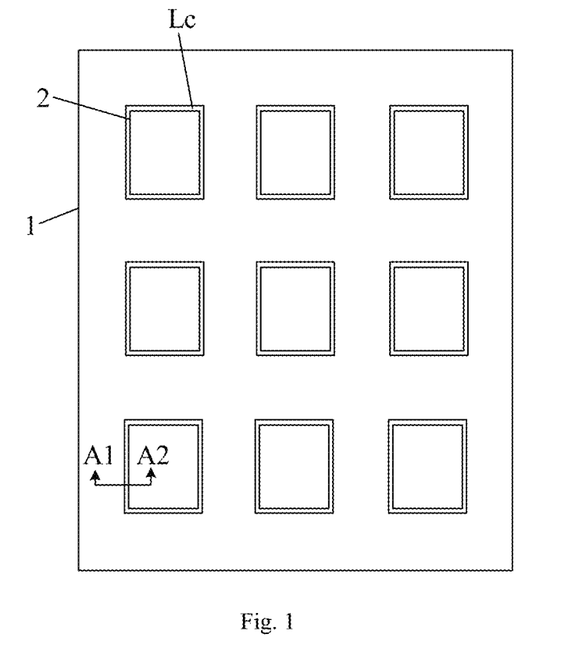
FIG. 1 is a schematic structural diagram of a flexible display substrate before stripping a rigid substrate in a manufacturing process provided by an embodiment of the present application.

As shown in FIG. 1, a rigid substrate 1 having a plurality of sub-regions is provided.

Figure 2:
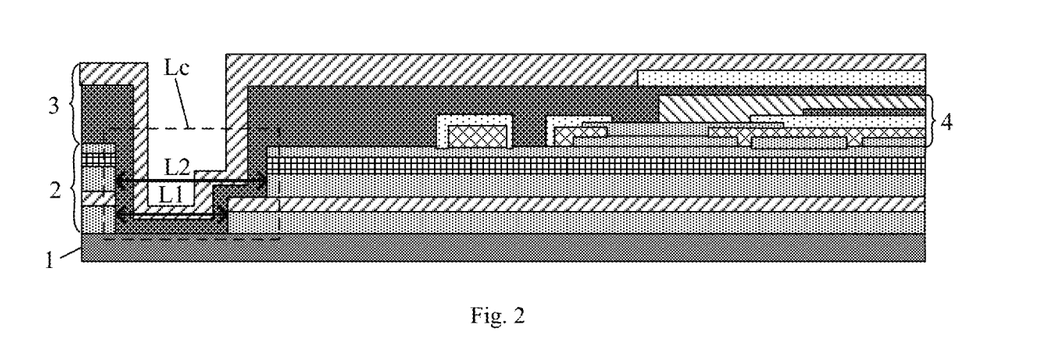
FIG. 2 is a schematic sectional view of a display substrate after depositing an encapsulation layer in an A1-A2 direction in FIG. 1 provided by an embodiment of the present application.

As shown in FIG. 1 and FIG. 2, a substrate base layer 2 and a functional layer 4 are formed on the rigid substrate 1, which includes: annular hollowed-out openings Lc corresponding to the sub-regions one by one are formed on the substrate base layer 2 through a patterning process, and each annular hollowed-out opening Lc surrounds a corresponding sub-region; and specifically, each annular hollowed-out opening Lc includes at least two layers of annular openings which are sequentially stacked in a direction perpendicular to the rigid substrate 1, an orthographic projection of an opening close to the rigid substrate 1 on the rigid substrate 1 is located in an orthographic projection of an opening away from the rigid substrate 1 on the rigid substrate 1, so that a stepped structure (a first stepped structure) is formed on side walls of the annular hollowed-out openings Lc. For example, the annular hollowed-out opening shown in FIG. 2 includes an opening L1 and an opening L2, a size of the opening L2 is larger than the opening L1, an orthographic projection of the opening L1 is located in an orthographic projection of the opening L2, so that the first stepped structure is formed on a side wall of the hollowed-out opening Lc of the substrate base layer 2.

As shown in FIG. 2, an inorganic encapsulation layer 3 is deposited on the substrate base layer 2, and the inorganic encapsulation layer 3 covers the side walls of the annular hollowed-out openings and makes contact with the rigid substrate 1.

Figure 3:
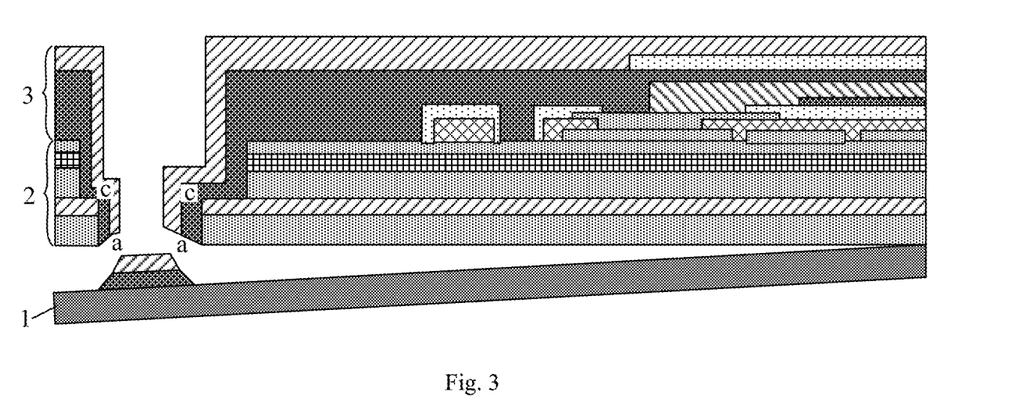
FIG. 3 is a schematic sectional view of a display substrate during stripping of a rigid substrate in the A1-A2 direction in FIG. 1 provided by an embodiment of the present application.
Figure 4:
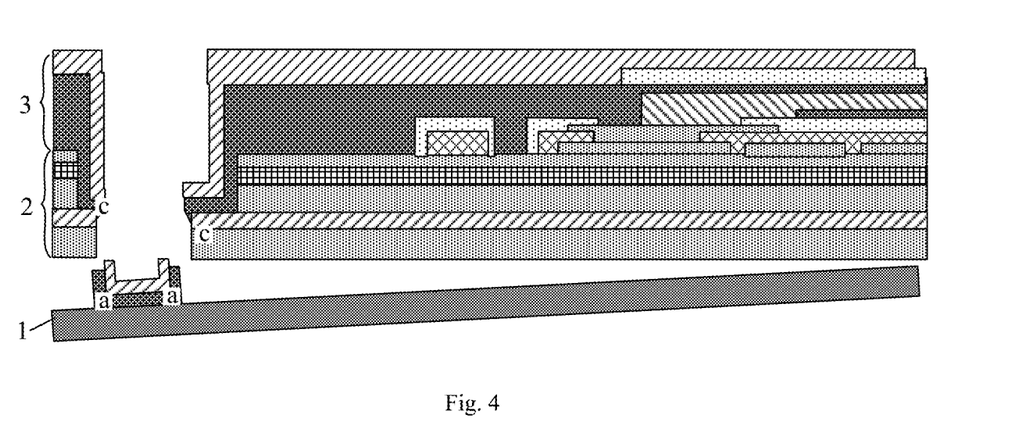
FIG. 4 is a schematic sectional view of a display substrate during stripping of a rigid substrate in the A1-A2 direction in FIG. 1 provided by another embodiment of the present application.

As shown in FIG. 3 and FIG. 4, the rigid substrate 1 is stripped off the substrate base layer 2, to enable the inorganic encapsulation layer 3 to be broken at the annular hollowed-out openings.

In the manufacturing method of the embodiment of the present application, as shown in FIG. 1 and FIG. 2, after the substrate base layer 2 is formed on the rigid substrate 1, the annular hollowed-out openings Lc are formed on the substrate base layer 2 through the patterning process, so that the substrate base layer 2 in each sub-region is separated alone, that is, the substrate base layer 2 of each display substrate is isolated. Then, the functional layer 4 and the encapsulation layer are sequentially manufactured, the inorganic encapsulation layer 3 in the encapsulation layer covers side edges of the functional layer 4 and the substrate base layer 2, and makes contact with the rigid substrate 1. In this way, when the substrate base layer 2 is stripped from the rigid substrate 1 through laser lift off (LLO) technology, the inorganic encapsulation layer 2 at the annular hollowed-out openings Lc is easy to break. Furthermore, independent sub-display substrates may be directly obtained without laser cutting, and thus the problems of encapsulation reliability and encapsulation width caused by cutting can be avoided.

Figure 5:
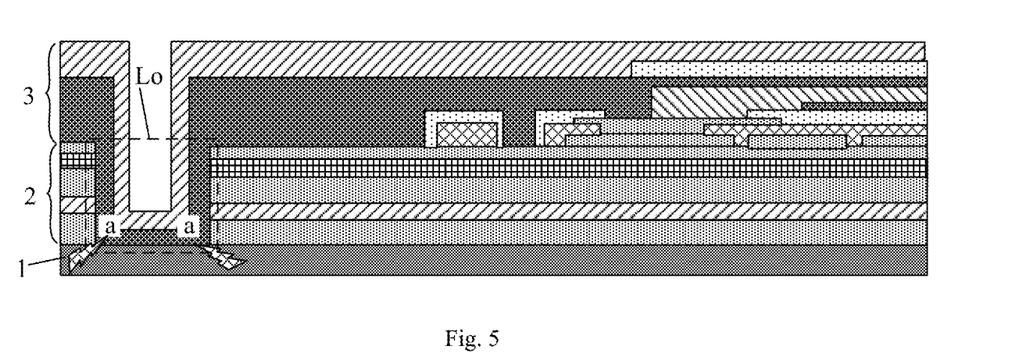
FIG. 5 is schematic sectional view of a display substrate after depositing an encapsulation layer in the A1-A2 direction in FIG. 1 in related art.
Figure 6:
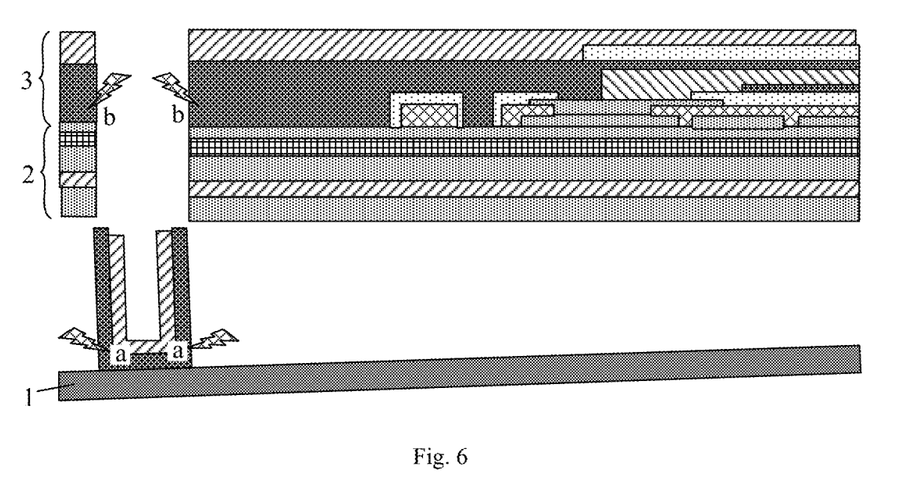
FIG. 6 is a schematic sectional view of the display substrate in FIG. 5 during stripping of a rigid substrate.

In addition, the inventor of the present application also found that if a vertically penetrating hollowed-out opening Lo is directly formed in the substrate base layer 2, as shown in FIG. 5 and FIG. 6, when stripping through LLO technology, the inorganic encapsulation layer 3 may be broken at a bottom side edge a of the hollowed-out opening Lo (as shown in FIG. 5, it is broken at the bottom side edge a), and the inorganic encapsulation layer 3 may also be broken at an upper side edge b of the hollowed-out opening Lo (as shown in FIG. 6, it is broken at the upper side edge b). When it is broken at the bottom side edge a, the inorganic encapsulation layer 3 may extend along the side to form lateral encapsulation, when it is broken at the upper side edge b, the lateral encapsulation of the inorganic encapsulation layer 3 may be damaged, and at this time, the reliability of the encapsulation layer still needs to be improved.

In view of this, in the manufacturing method of the embodiment of the present application, as shown in FIG. 2 and FIG. 4, when the annular hollowed-out openings Lc are formed through the patterning process, the stepped structure (the first stepped structure) having a process performance is formed on the side walls of the annular hollowed-out openings Lc. Specifically, two or more layers of openings which are stacked up and down are formed by multiple times of film layer etching, and an orthographic projection of a lower-layer opening (the opening close to the rigid substrate 1) is located in an orthographic projection of an upper-layer opening (the opening away from the rigid substrate 1), so that the first stepped structure is formed on the side walls of the annular hollowed-out openings Lc, and a thickness of a film layer covering the first stepped structure is smaller than a plane thickness. Therefore, it is easy to form a breaking region at a top corner c of the stepped structure. Specifically, the inorganic encapsulation layer 3 covers the first stepped structure of the side walls of the annular hollowed-out openings Lc and covers the rigid substrate 1 of a hollowed-out part. When the substrate base layer 2 is stripped from the rigid substrate 1, due to the thermal expansion and cold contraction and bottom carbonization of the substrate base layer 2 by laser scanning, the inorganic encapsulation layer 3 is easy to break at the bottom side edge a of the annular hollowed-out openings Lc (as shown in FIG. 3). Further, if there is no breaking at individual points of the bottom side edge a, breaking may also be generated at the top corner c of the stepped structure (as shown in FIG. 4), which can ensure that the inorganic encapsulation layer 3 of the substrate base layer 2 above the stepped structure is intact, so as to form the lateral encapsulation of the display substrate. In this way, the encapsulation reliability of the encapsulation layer can be effectively improved.

Figure 7:
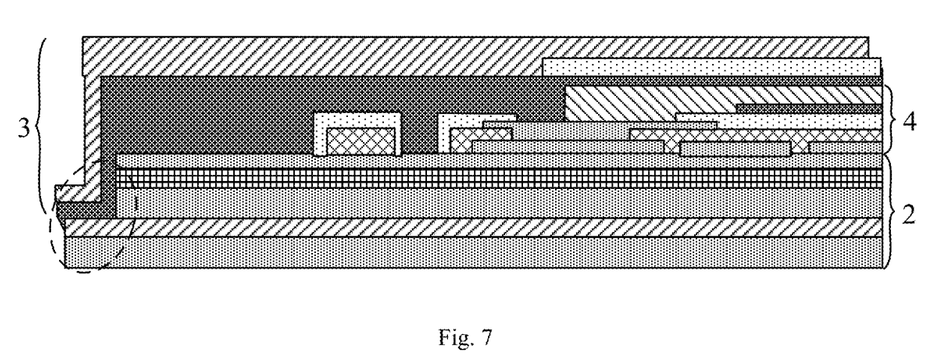
FIG. 7 is a partial schematic sectional view of a flexible display substrate provided by an embodiment of the present application.

Specifically, based on the above encapsulation method, the flexible display substrate with high encapsulation reliability may be obtained. Specifically, based on the inventive concept, an embodiment of the present application provides a flexible display substrate, as shown in FIG. 7. The flexible display substrate includes: a substrate base layer 2, peripheral side edges of the substrate base layer 2 having a first stepped structure (such as the structure surrounded by an elliptical dotted box in FIG. 7) with a process performance, and the first stepped structure being configured to enable a film layer (such as an inorganic encapsulation layer 3 in FIG. 7) covering the first stepped structure to be easily broken at the first stepped structure when a force is applied; a functional layer 4, provided on the substrate base layer 2 and exposed to the outside of the first stepped structure; and an inorganic encapsulation layer 3, covering side edges of the functional layer 4 and extending to the first stepped structure (such as the structure surrounded by the elliptical dotted box in FIG. 7) of the side edges of the substrate base layer 2.

In the flexible display substrate of the embodiment of the present application, the first stepped structure with the process performance is provided on the peripheral side edges of the substrate base layer 2, and in the manufacturing process of the flexible substrate, the inorganic encapsulation layer 3 covering the first stepped structure may be broken preferentially at the top corner of the first stepped structure or a lower stripping surface of the first stepped structure during stripping. Furthermore, the finally formed inorganic encapsulation layer 3 covers the side edge of the functional layer 4 and extends to the first stepped structure of the side edges of the substrate base layer 2, and the lateral encapsulation of the display substrate is realized. Therefore, the encapsulation reliability of the flexible display substrate is high.

In some embodiments, the substrate base layer is further provided an opening hole, for example, a functional hole used for setting a camera. Exemplarily, the side edge, at the opening hole, of the substrate base layer has a second stepped structure with a process performance. The second stepped structure is set in the same principle as the first stepped structure of the peripheral side edges of the substrate base layer, and is also configured to enable the film layer to be easily broken at the stepped structure when the force is applied.

Specifically, the inorganic encapsulation layer covers the side edge, at the opening hole, of the functional layer, and extends to the second stepped structure of the opening hole of the substrate base layer, that is, in the manufacturing process of the display substrate, during a stripping process, the inorganic encapsulation layer is broken at the second stepped structure of the functional opening or a lower stripping surface of the second stepped structure, so that in a final product, the edge of the inorganic encapsulation layer may extend to the second stepped structure, the lateral encapsulation of the functional opening of the display substrate is realized, and the encapsulation yield at the functional opening is improved.

In some embodiments, the flexible display substrate provided by the embodiment of the present application is a stretchable flexible display substrate.

Currently, OLED flexible display apparatuses with bending and foldability are being actively developed, and further, stretchable display apparatuses that can change shapes are also the development direction of display technology in the future.

At present, in a flexible display device, although each substrate, circuit layer, especially inorganic layer has a certain bending property, the amount of stretching is extremely limited. If stretched directly, an inorganic layer, an organic layer, a substrate, a circuit and so on used for encapsulation may be broken or irreversibly deformed. Therefore, in a conventional technology, a hollowed-out part is provided on the substrate, so that the amount of strain during stretching is released, and a stretchable display solution is realized. Specifically, a hollowed-out substrate has a plurality of island parts used for manufacturing pixel structures, to form a display unit, the whole display device is displayed by the pixel structures on the island parts, a hollowed-out structure is formed between adjacent island parts, the pixel structures on each island part needs to be encapsulated by the film layer, the larger the encapsulation edge of the encapsulation layer, the larger the pixel spacing on the adjacent island parts, and the worse the display effect. At present, an encapsulation edge size of a conventional encapsulation technology is above 700 um, it cannot be used in stretchable display devices, so how to reduce the encapsulation edge size of each island part of a stretchable display substrate while ensuring the encapsulation yield of the stretchable display devices is an urgent problem to be solved for the stretchable display devices.

Figure 8:
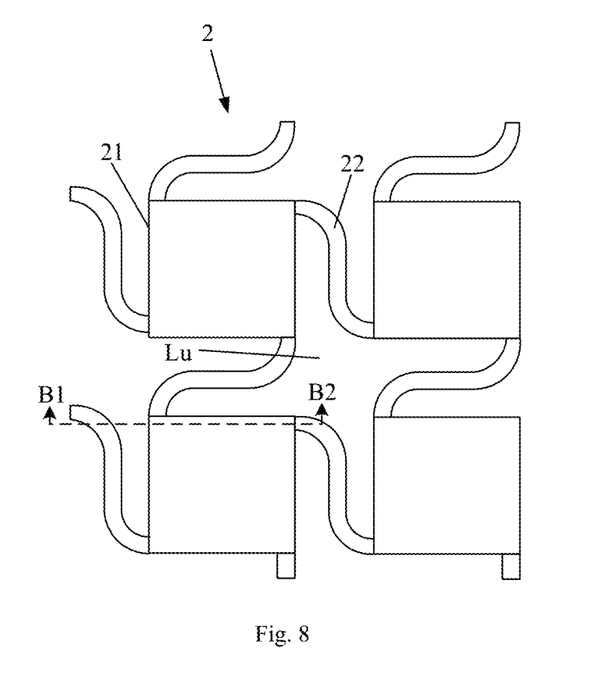
FIG. 8 is a partial schematic structural diagram of a stretchable flexible display substrate provided by an embodiment of the present application.
Figure 9:
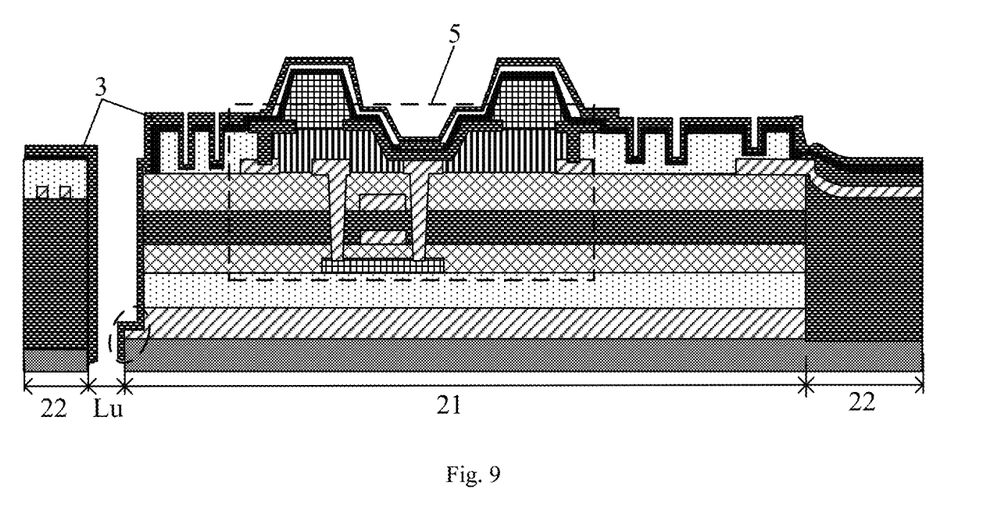
FIG. 9 is a partial schematic sectional view of a stretchable flexible display substrate in a B1-B2 direction in FIG. 8 provided by an embodiment of the present application.

Specifically, as shown in FIG. 8 and FIG. 9, in the stretchable flexible display substrate provided by the embodiment of the present application, the substrate base layer 2 includes a plurality of island parts 21, bridge parts 22 connecting the plurality of island parts 21 and hollowed-out parts Lu located between the island parts 21 and the bridge parts 22; and a third stepped structure (such as a structure surrounded by an elliptical dotted box in FIG. 9) with a process performance is provided on side edges, at the hollowed-out parts Lu, of the substrate base layer 2. The third stepped structure is set in the same principle as the first stepped structure of the peripheral side edges of the substrate base layer, and is also configured to enable the film layer to be easily broken at the stepped structure when the force is applied.

Specifically, the functional layer of the flexible display substrate includes pixel structures 5 corresponding to the island parts 21, and each pixel structure 5 is located on a corresponding island part 21. The inorganic encapsulation layer 3 covers a side edge of each pixel structure 5 and extends to the third stepped structure (such as the structure surrounded by the elliptical dotted box in FIG. 9) of the hollowed-out parts Lu of the substrate base layer 2, so that the lateral encapsulation of a structure of each island part 21 of the display substrate is realized, and the encapsulation yield of the stretchable display substrate is improved. Specifically, the 'pixel structure' in the present application may include one or more display pixels, and FIG. 9 schematically illustrates a structure of one display pixel.

In the stretchable flexible display substrate provided by the embodiment of the present application, the inorganic encapsulation layer 3 covers the sides of each island part 21 in the display substrate, the lateral encapsulation of each island part 21 is realized, so that the encapsulation reliability of a display unit of each island part 21 in the display substrate can be improved, a distance between the display units of adjacent island parts 21 can also be reduced, and thus a display effect of the stretchable display device can be effectively improved.

Exemplarily, as shown in FIG. 9, the third stepped structure at the hollowed-out parts Lu is located on the side edges of the island parts 21 of the substrate base layer 2.

Specifically, descriptions such as 'first', 'second' and 'third' in the present application are only used to distinguish structures of the same type, and do not limit the connection sequence or other aspects of the structures. For example, 'first stepped structure', 'second stepped structure' and 'third stepped structure' are used to distinguish process stepped structures at different positions of a substrate base material.

In some embodiments, in the embodiment of the present application, the process stepped structures (including the first stepped structure, the second stepped structure and the third stepped structure) include one or more steps, a step surface width of each step ranges from 5 μm to 25 μm, for example, 5 μm, 10 μm, 20 μm and 25 μm. Of course, the actual design of the products is not limited to the above widths, which can be improved according to the size of the display substrate.

In some embodiments, the substrate base layer is of a plurality of layers of structures composed of or including a flexible substrate and an inorganic insulating layer; and the process stepped structures (including the first stepped structure, the second stepped structure and the third stepped structure) include steps formed by staggering edges of adjacent layers of structures in the plurality of layers of structures and/or steps formed on edges of at least one layer in the plurality of layers of structures.

For example, the edges of the two adjacent layers of structures may be staggered by two times of etching to form the steps; or, the edges of one layer of structures are formed by two times of etching, and widths of the two times of etching are different, so that the edges of the layer of structures form the steps.

Exemplarily, in the manufacturing method for the flexible display substrate provided by the present application, the manufacturing process of the process stepped structures (including the first stepped structure, the second stepped structure and the third stepped structure) on the substrate base layer may specifically include the following operations.

Hollowed-out openings penetrating through the plurality of layers of structures are formed through the patterning process, and sizes of the hollowed-out openings of adjacent layers of structures in the plurality of layers of structures are different, to form the stepped structures.

Figure 10:
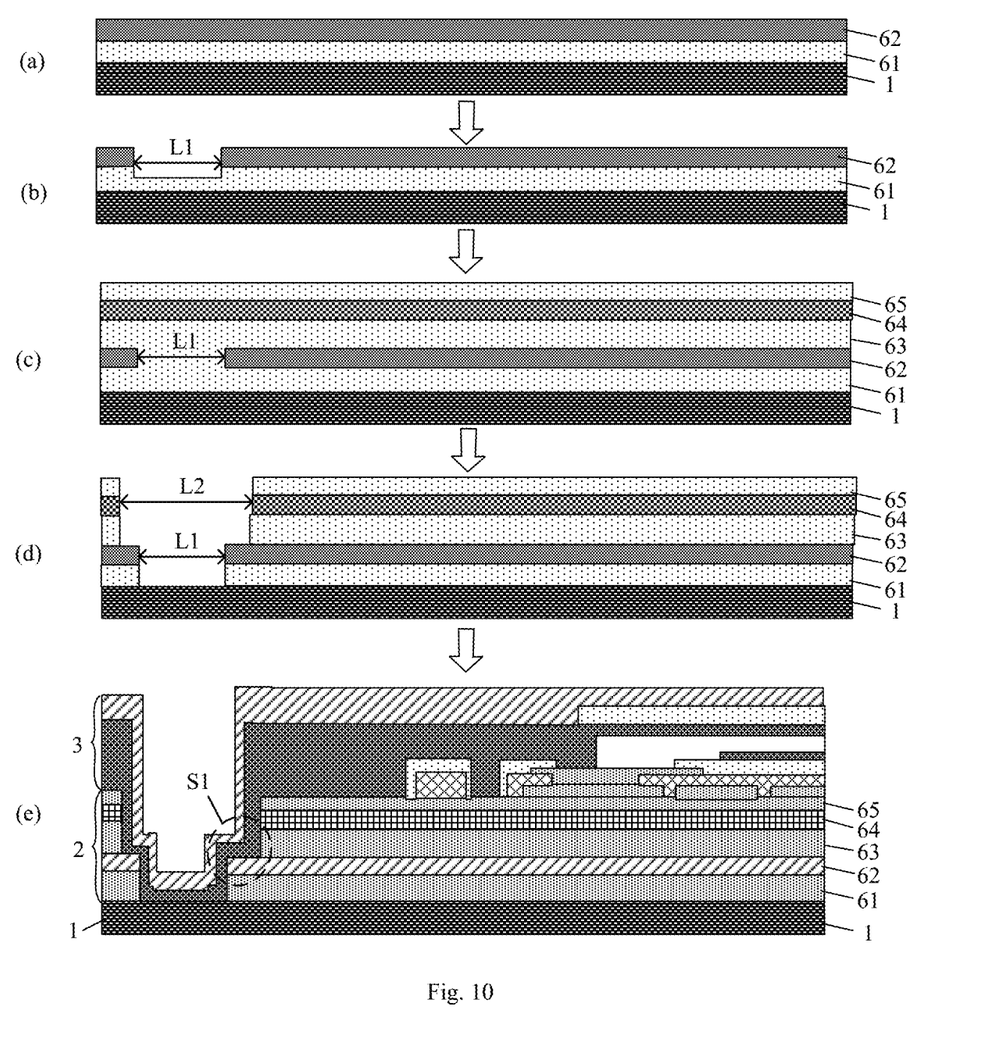
FIG. 10 is a schematic diagram of sectional changes of a flexible display substrate in a manufacturing process provided by an embodiment of the present application.

In some embodiments, as shown in (e) of FIG. 10, the substrate base layer 2 includes: a first-layer flexible substrate 61, a barrier layer 62, a second-layer flexible substrate 63, a buffer layer 64 and an interlayer insulating layer 65 which are sequentially provided; and specifically, the stepped structures (including the first stepped structure, the second stepped structure and the third stepped structure) include first steps S1 formed on edges of the barrier layer 62 and the second-layer flexible substrate 63.

Figure 11:
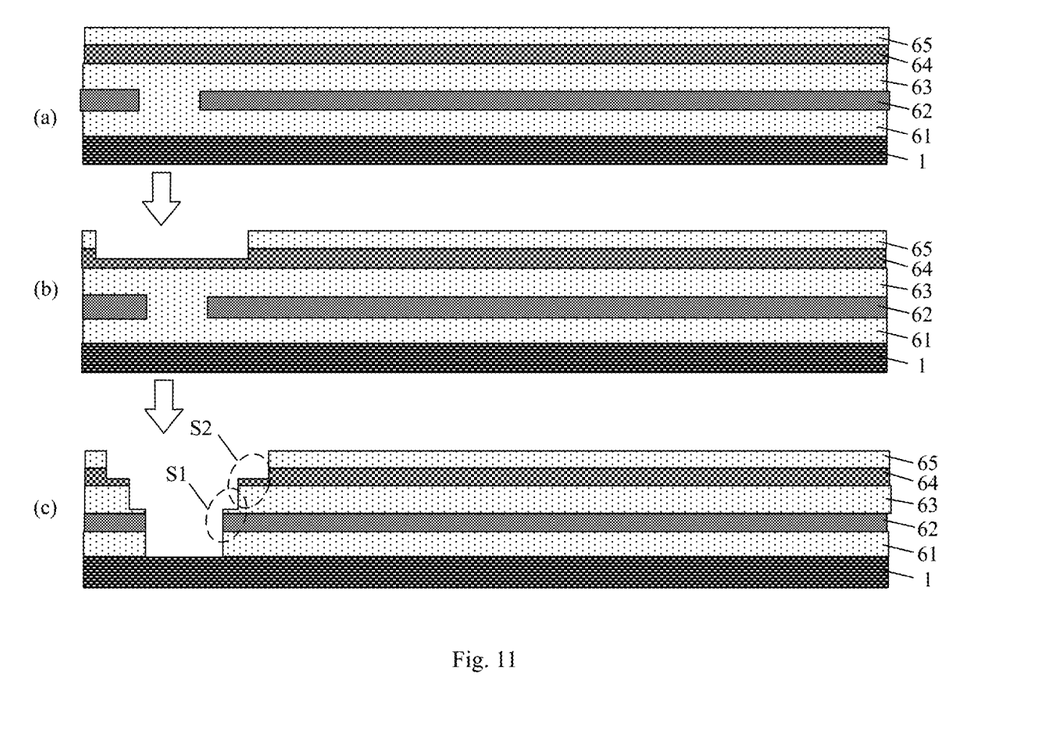
FIG. 11 is a schematic diagram of sectional changes of a flexible display substrate in a manufacturing process provided by another embodiment of the present application.

Furthermore, as shown in (c) of FIG. 11, in addition to the first steps S1 formed on the edges of the barrier layer 62 and the second-layer flexible substrate 63, the stepped structures may further include second steps S2 formed on edges of the interlayer insulating layer 65 and the buffer layer 64.

Figure 12:
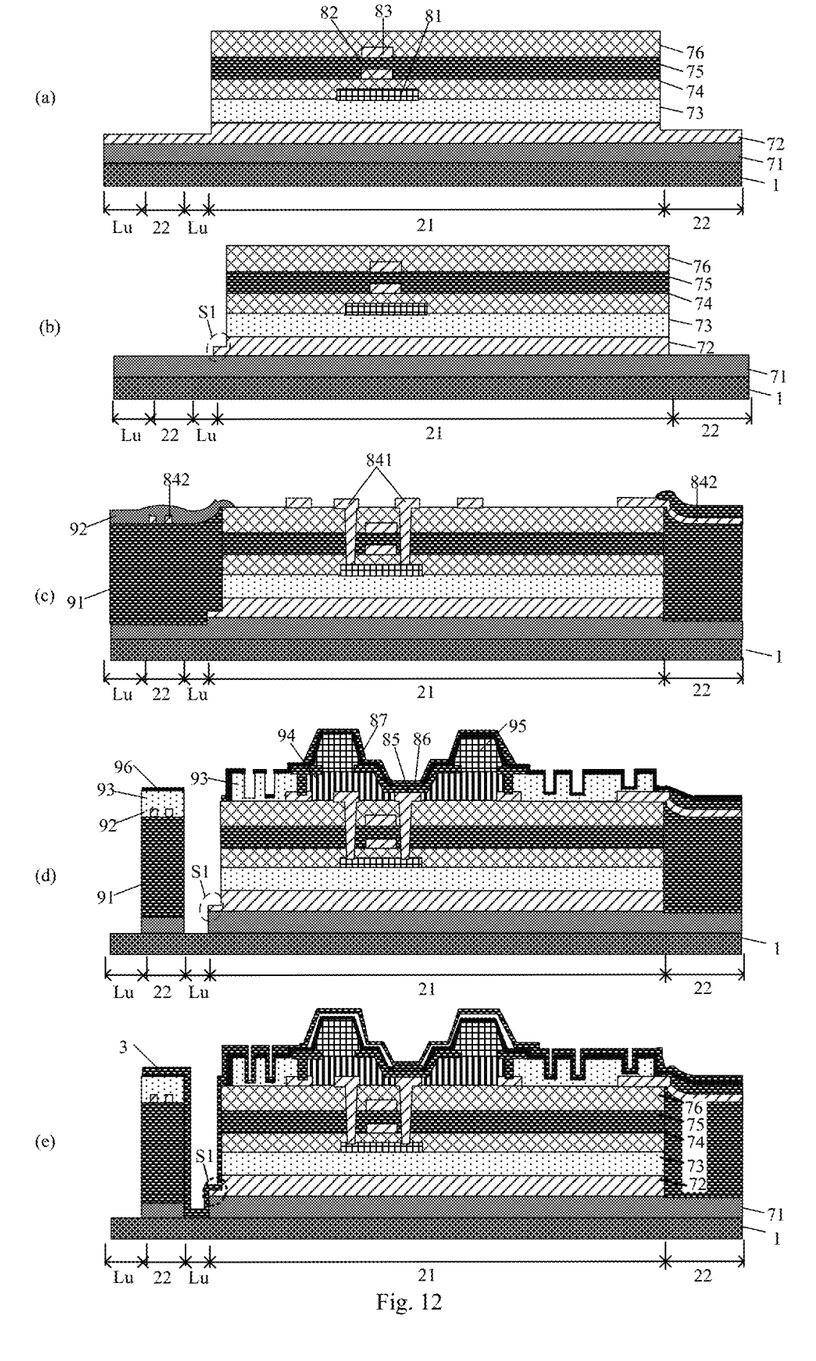
FIG. 12 is a schematic diagram of sectional changes of a flexible display substrate in a manufacturing process provided by another embodiment of the present application.

In some embodiments, the substrate base layer may also only have a single-layer flexible substrate, for example, as shown in (e) of FIG. 12, the substrate base layer 2 includes a flexible substrate 71, a barrier layer 72 and a buffer layer 73 which are sequentially provided. Specifically, the stepped structures (including the first stepped structure, the second stepped structure and the third stepped structure) include first steps S1 formed on edges of the barrier layer 72 and the buffer layer 73.

Specifically, next, the method for manufacturing the flexible display substrate provided by the embodiment of the present application is taken as an example for illustration.

Figure 13:
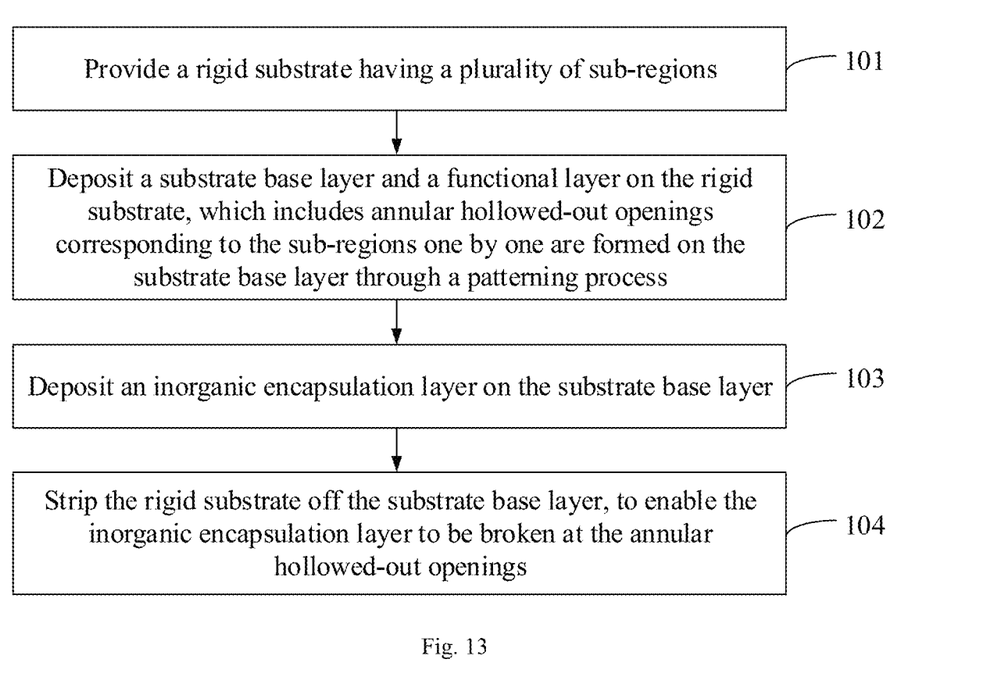
FIG. 13 is a manufacturing flow chart of a flexible display substrate provided by an embodiment of the present application.

Specifically, the method for manufacturing the flexible display substrate provided by the embodiment of the present application includes the following steps, as shown in FIG. 13.

Step 101, a rigid substrate having a plurality of sub-regions is provided.

Step 102, a substrate base layer and a functional layer are deposited on the rigid substrate, which includes annular hollowed-out openings corresponding to the sub-regions one by one are formed on the substrate base layer through a patterning process.

Step 103, an inorganic encapsulation layer is deposited on the substrate base layer, the inorganic encapsulation layer covering side walls of the annular hollowed-out openings and making contact with the rigid substrate.

Step 104, the rigid substrate is stripped off the substrate base layer, to enable the inorganic encapsulation layer to be broken at the annular hollowed-out openings.

In some embodiments, step 102 that the annular hollowed-out openings corresponding to the sub-regions one by one are formed on the substrate base layer further includes: as shown in FIG. 2, a first stepped structure is formed on inner side walls of the annular hollowed-out openings Lc.

As shown in FIG. 2, the inner side walls of the annular hollowed-out openings Lc finally form the peripheral edges of the display substrate, therefore, as long as the first stepped structure is formed on the inner side walls of the annular hollowed-out openings Lc, it may be ensured that during stripping, the inorganic encapsulation layer 3 on the display substrate may extend to the first stepped structure of the inner side walls.

Figure 14:
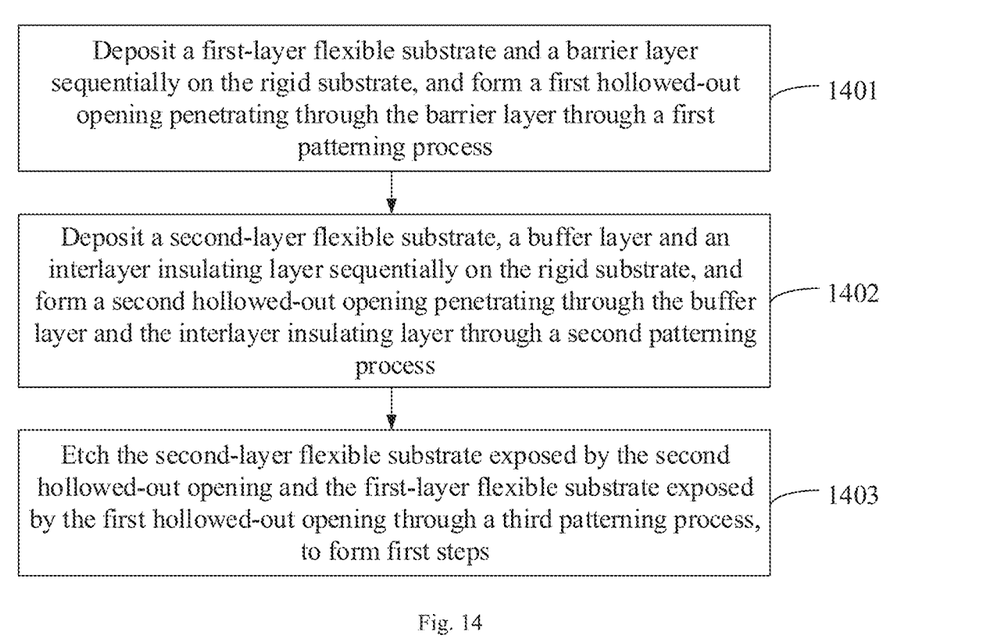
FIG. 14 is a further manufacturing flow chart of a flexible display substrate provided by an embodiment of the present application.

In some embodiments, step 102 that the substrate base layer is deposited on the rigid substrate and the annular hollowed-out openings corresponding to the sub-regions one by one are formed on the substrate base layer through the patterning process further includes steps 1401 to 1403 as shown in FIG. 14.

Step 1401, as shown in (a) and (b) of FIG. 10, a first-layer flexible substrate 61 and a barrier layer 62 are sequentially deposited on the rigid substrate 1, and a first hollowed-out opening L1 penetrating through the barrier layer 62 is formed through a first patterning process.

Step 1402, as shown in (c) of FIG. 10, a second-layer flexible substrate 63, a buffer layer 64 and an interlayer insulating layer 65 are sequentially deposited on the rigid substrate 1; and as shown in (d) of FIG. 10, a second hollowed-out opening L2 penetrating through the buffer layer 64 and the interlayer insulating layer 65 is formed through a second patterning process, where a width of the second hollowed-out opening L2 is larger than a width of the first hollowed-out opening L1, and an orthographic projection of the second hollowed-out opening L2 on the rigid substrate 1 covers an orthographic projection of the first hollowed-out opening L1 on the rigid substrate 1.

Step 1403, as shown in (d) of FIG. 10, the second-layer flexible substrate 63 exposed by the second hollowed-out opening L2 and the first-layer flexible substrate 61 exposed by the first hollowed-out opening L1 are etched through a third patterning process, to form first steps S1 as shown in (e) of FIG. 10.

Exemplarily, step 202 that the second hollowed-out opening penetrating through the buffer layer 64 and the interlayer insulating layer 65 is formed through the second patterning process further includes: as shown in FIG. 11, the second hollowed-out opening is formed through two times of etching before and after, the interlayer insulating layer 65 is etched for the first time (as shown in (b) of FIG. 11), the buffer layer 64 is etched for the second time (as shown in (c) of FIG. 11), sizes of openings of the two times of etching are different, so that an inner side wall of the finally formed second hollowed-out opening is in a stepped shape, and second steps S2 are formed.

Figure 15:
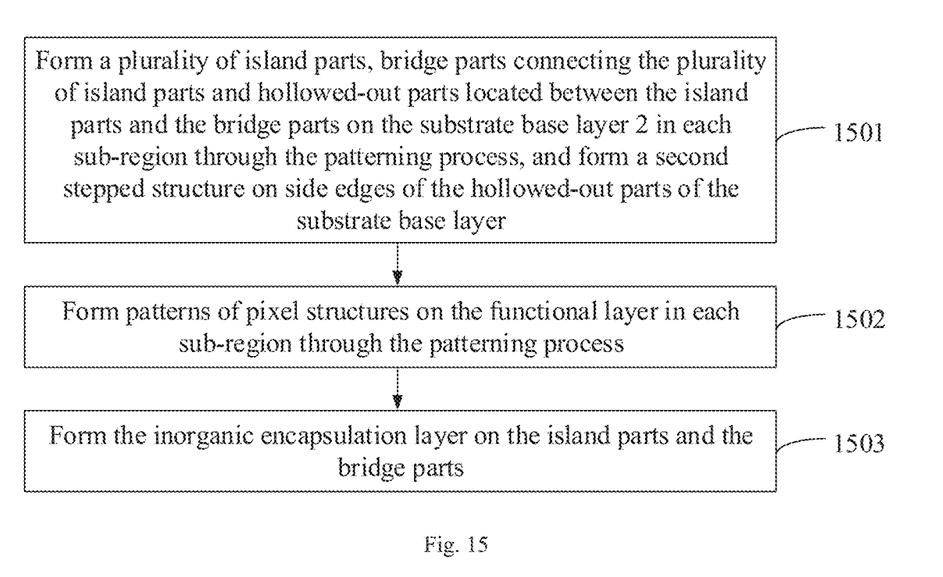
FIG. 15 is a further manufacturing flow chart of a flexible display substrate provided by an embodiment of the present application.

In some embodiments, the flexible display substrate is a stretchable flexible display substrate, and the manufacturing method of the embodiment of the present application may further include steps 1501 to 1503, as shown in FIG. 8, FIG. 9 and FIG. 15.

Step 1501, a plurality of island parts 21, bridge parts 22 connecting the plurality of island parts 21 and hollowed-out parts Lu located between the island parts 21 and the bridge parts 22 are formed on the substrate base layer 2 in each sub-region through the patterning process, and a second stepped structure is formed on side edges of the hollowed-out parts Lu of the substrate base layer 2.

Step 1502, patterns of pixel structures 5 are formed on the functional layer 4 in each sub-region through the patterning process, where the pixel structures 5 correspond to the island parts 21, and each pixel structure 5 is located on a corresponding island part 21.

Step 1503, the inorganic encapsulation layer 3 is formed on the island parts 21 and the bridge parts 22, the inorganic encapsulation layer 3 covering a side edge of each pixel structure 5 and extending to the second stepped structure of the hollowed-out parts Lu of the substrate base layer 2.

Exemplarily, a specific process of the stretchable flexible display substrate provided by the embodiment of the present application may include: as shown in (a) of FIG. 12, a flexible substrate 71, a barrier layer 72, a buffer layer 73, a first gate insulating layer 74, a second gate insulating layer 75 and an interlayer insulating layer 76 are sequentially manufactured on the rigid substrate 1; specifically, among the steps for manufacturing the buffer layer 73, the first gate insulating layer 74, the second gate insulating layer 75 and the interlayer insulating layer 76, the steps for manufacturing an active layer pattern 81, a first gate layer pattern 82 and a second gate layer pattern 83 may further be included; and the active layer pattern 81, the first gate layer pattern 82 and the second gate layer pattern 83 are located on the island parts 21.

As shown in (a) of FIG. 12, the buffer layer 73, the first gate insulating layer 74, the second gate insulating layer 75 and the interlayer insulating layer 76 at the bridge parts 22 and the hollowed-out parts Lu are etched through the first patterning process.

As shown in (b) of FIG. 12, the barrier layer 72 at the bridge parts 22 and the hollowed-out parts Lu is etched through the second patterning process, a size of an etching opening of the second patterning process is smaller than a size of an etching opening of the first patterning process, so that part of the barrier layer 72 of the edges, close to the island parts 21, of the hollowed-out parts Lu is reserved, and the barrier layer 72 extends beyond the side edge of the buffer layer 73, to form a stepped structure S1 (the second stepped structure) on the side edges of the island parts 21.

As shown in (c) of FIG. 12, a first planarization layer 91 is deposited on the bridge parts 22 and the hollowed-out parts Lu, source-drain metal layer patterns (including patterns such as a source-drain electrode 841 and a metal routing 842) are manufactured on the island parts 21 and the bridge parts 22, and then a second planarization layer 92 is deposited on positions of the bridge parts 22 and the hollowed-out parts Lu, to cover and protect the metal routing 842 on the bridge parts 22.

As shown in (d) of FIG. 12, a pattern of a first inorganic protection layer 93 is formed on positions of the island parts 21 and the bridge parts 22; and a pattern of a third planarization layer 94 is formed on the island parts 21, and then a pattern of an anode layer 85 and a pattern of a pixel definition layer 95 are sequentially formed on the island parts 21.

As shown in (d) of FIG. 12, a second inorganic protection layer 96 is deposited on the whole substrate, then the second inorganic protection 96, a second planarization layer 92 and the first planarization layer 91 of the hollowed-out parts Lu are etched through the third patterning process, to expose the rigid substrate 1 and the part (the stepped structure S1), extending beyond the side edge of the buffer layer 73, of the barrier layer 72.

As shown in (d) of FIG. 12, a pattern of a light-emitting layer 86 and a pattern of a cathode layer 87 are sequentially formed on the island parts 21.

As shown in (e) of FIG. 12, an encapsulation layer is manufactured, specifically, the encapsulation layer may include an inorganic encapsulation layer 3 and an organic encapsulation layer (not shown in figure), a pattern of the organic encapsulation layer does not cover the hollowed-out parts Lu, a pattern of the inorganic encapsulation layer 3 covers the whole substrate (that is, the island parts 21, the bridge parts 22 and the hollowed-out parts Lu are covered at the same time); part of a film layer structure, in the hollowed-out parts Lu, of the inorganic encapsulation layer 3 covers the side edge (including the stepped structure S1 formed on the edge of the barrier layer 72) of each film layer on the island parts 21, and makes contact with the rigid substrate 1 at bottoms of the hollowed-out parts Lu.

As shown in (e) of FIG. 12 and FIG. 9, the rigid substrate 1 is stripped, the inorganic encapsulation layer 3 will be broken at the stepped structure S1 of the edge of the barrier layer 72, while, the part, covering the side edges of the film layers on the island parts 21, of the inorganic encapsulation layer 3 may be broken and damaged, so that the inorganic encapsulation layer 3 can form good lateral encapsulation on the island parts 21.

Specifically, an embodiment of the present application further provides a display apparatus, including any of the above described flexible display substrates.

Exemplarily, the display apparatus is a flexible display product, may be a stretchable display product, and may also be a conventional foldable product, which may be specifically applied to narrow frame encapsulation structures such as a mobile phone, a TV or a splicing screen.

It should be noted that in some embodiments of the present disclosure, a display module and the flexible display substrate may further include other structures, which can be determined according to actual needs, and the embodiments of the present disclosure are not limited to this. In addition, in the display substrate provided by the embodiment of the present disclosure, the design of positions, shapes and sizes of some structures is not limited to the above-mentioned embodiments, the specific step flow and process of the manufacturing method for the display substrate are also not limited to the above-mentioned embodiments, and these can be improved according to the actual needs in practical applications. For details, reference may be made to the descriptions of the structural and functional requirements above, which will not be repeated here.

Obviously, those skilled in the art can make various changes and modifications to the present application without departing from the spirit and scope of the present application. As such, provided that these modifications and variations of the present application fall within the scope of the claims of the present application and their equivalents, the present application is also intended to cover such modifications and variations.

What is claimed is:

1. A flexible display substrate, comprising:
  a substrate base layer, peripheral side edges of the substrate base layer having a first stepped structure with a process performance, and the first stepped structure being configured to enable a film layer covering the first stepped structure to be easily broken at the first stepped structure;
a functional layer, located on the substrate base layer and exposing the first stepped structure; and
an inorganic encapsulation layer, covering side edges of the functional layer and extending to the first stepped structure of the side edges of the substrate base layer, wherein
the substrate base layer comprises a first-layer flexible substrate, a barrier layer, a second-layer flexible substrate, a buffer layer and an interlayer insulating layer which are sequentially provided; and
the first stepped structure comprises first steps formed on edges of the barrier layer and the second-layer flexible substrate.

2. The flexible display substrate according to claim 1, wherein
the first stepped structure further comprises second steps formed on edges of the interlayer insulating layer and the buffer layer.

3. A flexible display substrate comprising:
a substrate base layer, peripheral side edges of the substrate base layer having a first stepped structure with a process performance, and the first stepped structure being configured to enable a film layer covering the first stepped structure to be easily broken at the first stepped structure;
a functional layer, located on the substrate base layer and exposing the first stepped structure; and
an inorganic encapsulation layer, covering side edges of the functional layer and extending to the first stepped structure of the side edges of the substrate base layer;
wherein the flexible display substrate is a stretchable flexible display substrate;
the substrate base layer comprises a plurality of island parts, bridge parts connecting the plurality of island parts and hollowed-out parts located between the island parts and the bridge parts; a third stepped structure with a process performance is provided on side edges, at the hollowed-out parts, of the substrate base layer, and the third stepped structure is configured to enable a film layer covering the third stepped structure to be easily broken at the third stepped structure;
the functional layer comprises pixel structures corresponding to the island parts, and each of the pixel structures is located on a corresponding island part; and
the inorganic encapsulation layer covers a side edge of the each pixel structure and extends to the third stepped structure of the hollowed-out parts of the substrate base layer;
wherein the substrate base layer comprises a flexible substrate, a barrier layer and a buffer layer which are sequentially provided; and
the first stepped structure and the third stepped structure comprise first steps formed on edges of the barrier layer and the buffer layer.

4. A display apparatus, comprising the flexible display substrate according to claim 1.

5. The flexible display substrate according to claim 1, wherein the substrate base layer is provided with an opening hole, a second stepped structure with a process performance is provided on a side edge, at the opening hole, of the substrate base layer, and the second stepped structure is configured to enable a film layer covering the second stepped structure to be easily broken at the second stepped structure; and
the inorganic encapsulation layer covers a side edge, at the opening hole, of the functional layer, and extends to the second stepped structure at the opening hole of the substrate base layer.

6. The flexible display substrate according to claim 5, wherein the first stepped structure comprises one or more steps, and a step surface width of each of the one or more steps ranges from 5 μm to 25 μm.

7. A flexible display substrate, comprising:
a substrate base layer, peripheral side edges of the substrate base layer having a first stepped structure with a process performance, and the first stepped structure being configured to enable a film layer covering the first stepped structure to be easily broken at the first stepped structure;
a functional layer, located on the substrate base layer and exposing the first stepped structure; and
an inorganic encapsulation layer, covering side edges of the functional layer and extending to the first stepped structure of the side edges of the substrate base layer;
wherein the substrate base layer is of a plurality of layers of structures comprising a flexible substrate and an inorganic insulating layer; and the first stepped structure comprises steps formed by staggering edges of adjacent layers of structures in the plurality of layers of structures and/or steps formed on edges of at least one layer in the plurality of layers of structures;
wherein the flexible display substrate is a stretchable flexible display substrate;
the substrate base layer comprises a plurality of island parts, bridge parts connecting the plurality of island parts and hollowed-out parts located between the island parts and the bridge parts; a third stepped structure with a process performance is provided on side edges, at the hollowed-out parts, of the substrate base layer, and the third stepped structure is configured to enable a film layer covering the third stepped structure to be easily broken at the third stepped structure;
the functional layer comprises pixel structures corresponding to the island parts, and each of the pixel structures is located on a corresponding island part; and
the inorganic encapsulation layer covers a side edge of the each pixel structure and extends to the third stepped structure of the hollowed-out parts of the substrate base layer.

8. The flexible display substrate according to claim 7, wherein the first stepped structure comprises one or more steps, and a step surface width of each of the one or more steps ranges from 5 μm to 25 μm.

9. The flexible display substrate according to claim 3, wherein the third stepped structure at the hollowed-out parts is located on side edges of the island parts of the substrate base layer.

10. The flexible display substrate according to claim 7, wherein the third stepped structure at the hollowed-out parts is located on side edges of the island parts of the substrate base layer.

11. A display apparatus, comprising the flexible display substrate according to claim 3.

12. A display apparatus, comprising the flexible display substrate according to claim 7.

* * * * *